United States Patent
Chiarulli et al.

(10) Patent No.: US 7,358,869 B1
(45) Date of Patent: Apr. 15, 2008

(54) POWER EFFICIENT, HIGH BANDWIDTH COMMUNICATION USING MULTI-SIGNAL-DIFFERENTIAL CHANNELS

(75) Inventors: Donald M. Chiarulli, Pittsburgh, PA (US); Steven P. Levitan, Pittsburgh, PA (US)

(73) Assignee: University of Pittsburgh, Pittsburgh, PA (US)

( * ) Notice: Subject to any disclaimer, the term of this patent is extended or adjusted under 35 U.S.C. 154(b) by 713 days.

(21) Appl. No.: 10/923,111

(22) Filed: Aug. 20, 2004

Related U.S. Application Data (60) Provisional application No. 60/496,999, filed on Aug. 20, 2003.

(51) Int. Cl.
*H03M 5/00* (2006.01)
(52) U.S. Cl. .................................... 341/58; 341/143
(58) Field of Classification Search .............. 341/58, 341/57, 50, 143; 370/201; 375/257
See application file for complete search history.

(56) References Cited

U.S. PATENT DOCUMENTS

| | | | |
|---|---|---|---|
| 6,556,628 B1 * | 4/2003 | Poulton et al. | 375/257 |
| 6,844,833 B2 * | 1/2005 | Cornelius et al. | 341/58 |
| 2003/0099190 A1 * | 5/2003 | Zerbe | 370/201 |

* cited by examiner

*Primary Examiner*—Peguy JeanPierre (57) ABSTRACT

A low-power, area and pin efficient signaling alternative to serial differential links used for chip-to-chip, backplane, optical and other signaling applications. The multi-bit differential signaling (MBDS) generally comprises a driver and link termination network design coupled with a coding system based on n choose M (nCm) coding. MBDS has comparable electrical characteristics to conventional low-voltage differential signaling (LVDS) and is fully compatible with existing LVDS receivers in point-to-point and multi-point bus topologies. However, MBDS uses up to 40% less power, with up to 33% fewer I/O pads than equivalent LVDS links.

19 Claims, 9 Drawing Sheets

POWER EFFICIENT, HIGH BANDWIDTH COMMUNICATION USING MULTI-SIGNAL-DIFFERENTIAL CHANNELS

CROSS-REFERENCE TO RELATED APPLICATIONS

This application claims the benefit under 35 U.S.C. 119(e) of the earlier filing date of U.S. Provisional Patent Application No. 60/496,999 filed on Aug. 20, 2003.

BACKGROUND OF THE INVENTION

1. Field of the Invention

The present invention relates generally to systems and methods for electronic signaling, and, more particularly, the present invention is directed to a multi-bit differential signaling alternative to traditional differential signaling methodologies.

2. Description of the Background

Electrical communication links have long embraced the use of differential signaling for low noise and high bandwidth data transmission. For example, high performance data channels are of increasing importance for applications such as chip-to-chip PCB (PC Board) interconnect and disk drive data channels as smaller features and lower voltages drive the economics of CMOS design away from traditional bit-per-wire I/O. Although the reasons behind using certain signaling schemes may differ for various applications, all of these (and other) communications activities reflect a need to produce continually higher bandwidth, higher speed applications, without losing the benefits of existing technologies.

Taking chip-to-chip signaling as an example, there are two important trends in CMOS digital and mixed-signal technology that are motivating designers to seek higher bandwidth off-chip signaling solutions. The first is a technology trend driven by the traditional gap between on-chip and off-chip signal bandwidth. This gap continues to widen as CMOS technology advances faster than PCB fabrication and materials technology and has become a substantial bottleneck in overall system performance.

The second trend is based on changes in the economics of chip production for high-speed and low power devices in deep sub-micron technologies. When measuring overall power consumption, silicon real estate and chip packaging costs for these devices, it is cheaper to organize the off-chip signaling into a small number of high speed serial I/O lines rather than the traditional bit-per-pin I/O organizations.

Consistent with these trends, the semiconductor industry association has projected chip-to-chip I/O links capable of 10 Gbps over 40 cm of FR-4 PCB material in near-term generations of microprocessors. For the present, commercial signaling standards have emerged in the 200 to 800 Mbps/pin range. Examples of these new high-speed signaling standards include: Hypertransport, a bus standard at 400 Mbps/pin; QRSL, a high density memory interconnect from RAMBUS that achieves 800 Mbps/pin using 4-level logic; and two LVDS standards, TIA/EIA-644-A at 655 Mbps and IEEE 1563 at 500 Mbps. At gigabit rates, Hypertransport 2 has emerged recently with a 1 Gbps/pin speed grade option at the high end. It is clear that significant opportunity exists for chip-to-chip, backplane, optical and other signaling standards with 1 to 2.5 Gbps/channel capabilities with longer term prospects for operation at 10 Gpbs.

In all of the current and proposed standards for high speed chip-to-chip links, channel coding is based on some form of differential signaling. Specifically, in a differentially encoded data bus, each bit is encoded based on an oppositely charged pair of conductors. Each state, '0' or '1', is encoded as one of two code words represented by the two polarities, on-off {10} or off-on {01}. Thus, the number of physical wires in the link is equal to twice the bit-width of the link.

Accordingly, differentially encoded busses have a significant disadvantage in high-speed communication links. The disadvantage of differential signaling stems from its low code density—using only half of the signaling capacity of the available transmission lines.

Although described as such, this problem with differential signaling is not limited to proposed chip-to-chip link standards within multi-chip-modules and printed circuit boards. Longer length data channels, (on the order of up to a meter in length) such as module-to-module level (backplane), and cabinet-to-cabinet communications links, are typically based on differential signaling and are characterized by similar concerns. Likewise, optical fiber based solutions for the same distance ranges typically use differential driver and receiver circuits while discarding and regenerating one of the two states at each end of a single-ended fiber channel. The overall cost and performance of all of these links can be improved using the techniques of the present invention.

Other technology trends suggest the near term adoption of differentially encoded buses in intra-chip links. (distance scales of a few centimeters, spanning the area of very large scale semiconductor devices). As lower supply voltage drives down transistor thresholds, leakage current increases significantly in the repeating buffers required. Simultaneously, higher bandwidth and smaller feature size has decreased the distance between these buffers, increasing their number and thus the total power lost to leakage current. In this environment, current-mode, differentially encoded buses are becoming popular The present invention, in at least one preferred embodiment, provides an alternative to these differential transmission schemes using a multi-bit differential signaling methodology. The present systems and methods preferably retain the noise and loss advantages of conventional differential signaling but significantly increase the code density and use less power and fewer communication channels than comparable prior art systems.

SUMMARY OF THE INVENTION

In accordance with at least one preferred embodiment, the present invention provides an alternative to differential signaling for channel encoding of high-speed data bus applications. The method, called Multi-Bit Differential Signaling (MBDS), retains the noise and loss advantages of conventional differential signaling, but increases the code density of equivalent differentially encoded bus structures. By exploiting a larger set of assignable code symbols, an MBDS encoded bus can send the same information across fewer physical connections than a differentially-encoded bus with the same bit width. The result is a substantial savings in power, area and pad count.

Figure 2:
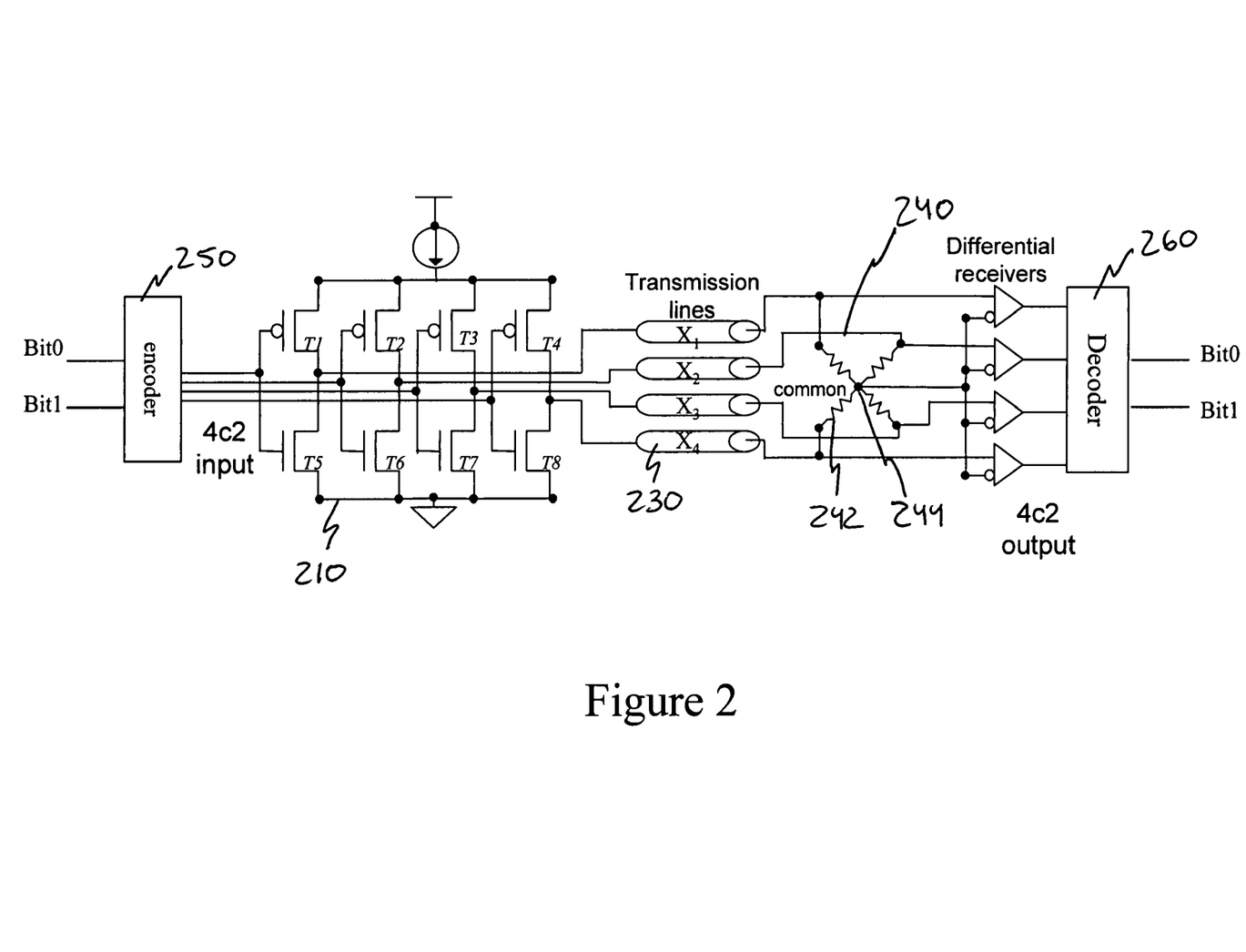
FIG. 2 depicts an exemplary architecture for a 4C2 multi-bit differential link.
Figure 3A:
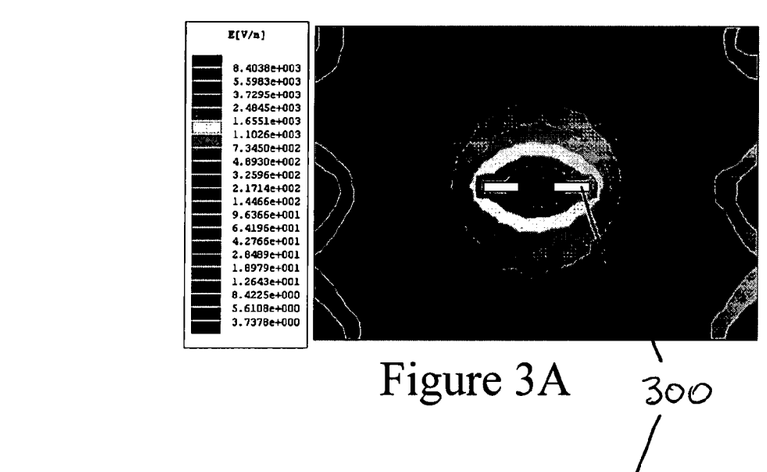
FIG. 3 shows exemplary calculated EMI fields for various multi-layer PCB transmission line orientations utilizing single-layer (FIGS. 3A-3D) and multi-layer (FIGS. 3E-3G) PC boards.
Figure 3B:
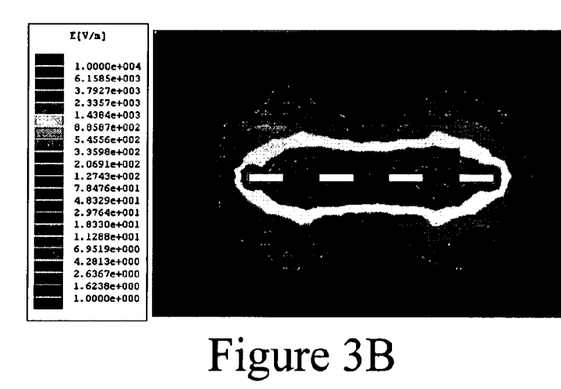
Figure 3C:
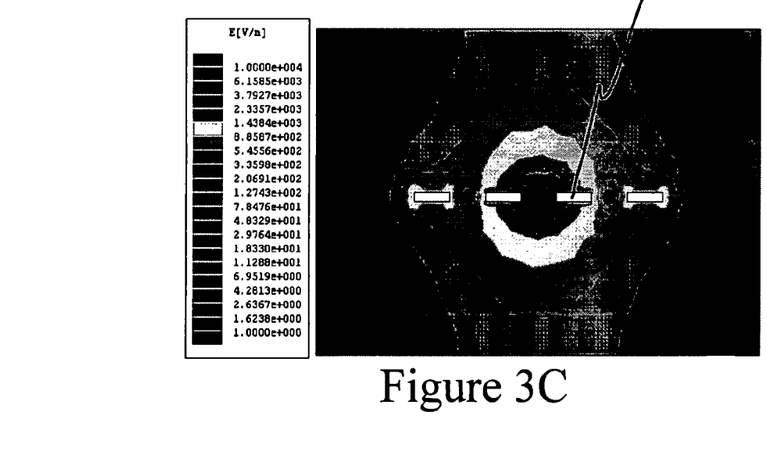
Figure 3D:
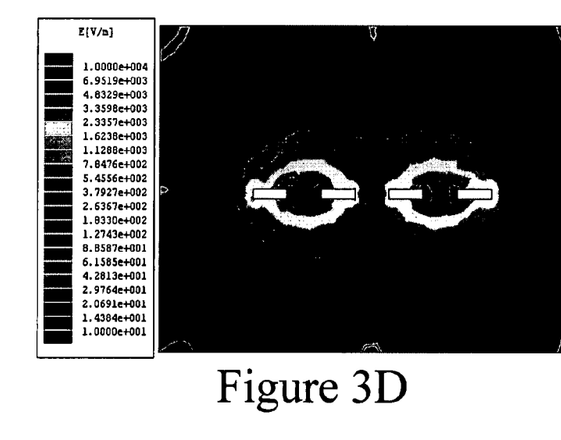
Figure 3E:
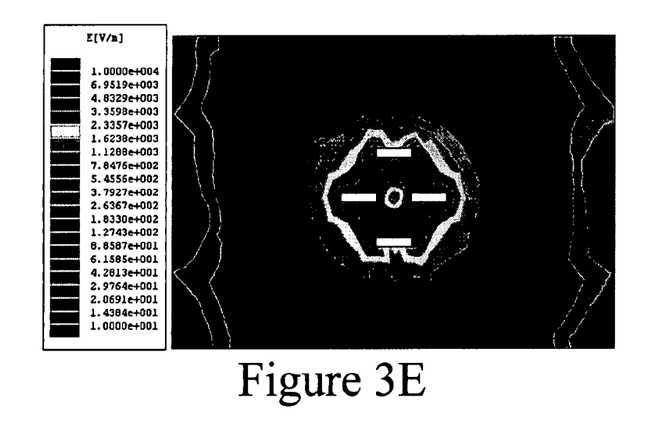
Figure 3F:
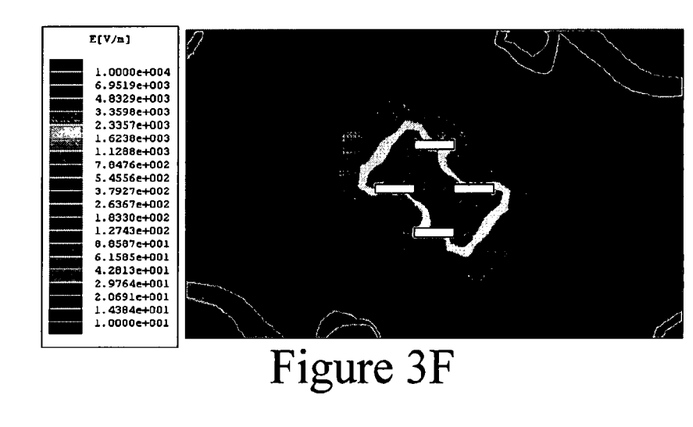
Figure 3G:
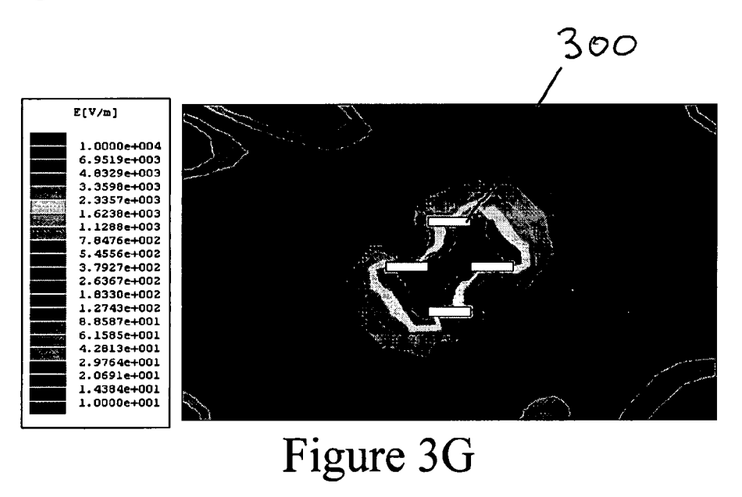

Three general concepts, shown in FIG. 2, are incorporated into the basic MBDS methodology. First, a driver circuit 210 based on a current-steering design is extended to drive multiple current mode logic channels. Second, a termination network 240 that terminates each channel (transmission lines 230) to a single point and creates a self-consistent common node 244 within the termination network 240 is utilized. Finally, an "n choose m" (nCm) encoding rule is used for the data symbols in the channel such that each n-bit symbol encoding must have exactly m 1-bits and n−m 0-bits.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein.

DETAILED DESCRIPTION OF THE INVENTION

It is to be understood that the figures and descriptions of the present invention have been simplified to illustrate elements that are relevant for a clear understanding of the invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided hereinbelow with reference to the attached drawings.

As briefly described above, the present invention utilizes a multi-bit differential signaling (MBDS) methodology applied to an improved communications link topology to increase code density and decrease power consumption without sacrificing the performance expected of conventional differential links. In an MBDS link, the two wire per bit format of conventional differential signaling is replaced with an n-wire system in which all of the code symbols in the link must conform to an "n choose m" (nCm) encoding rule. In an nCm code, each n-bit symbol encoding must have exactly m 1-bits and n−m 0 bits.

For example, a 4C2 (4 choose 2) communications channel utilizes a four-wire (n=4) interconnect such that at any time exactly two of the wires will be energized with 1-bits (m=2). When compared to the same four wires configured as two differential channels, the 4C2 MBDS channel has roughly 35% greater information throughput capacity. Consider that the 4C2 channel can transmit any of the code symbols in the set {0011, 0101, 0110, 1001, 1010, 1100}. The two differential channel link, on the other hand, is restricted to the code symbol set {0101, 1010, 0110, 1001} because each "group" of two bits must be 01 or 10. This corresponds to 2.5 bits of throughput for the 4C2 channel versus 2 bits for the differentially encoded channels, a 25% improvement.

Figure 1:
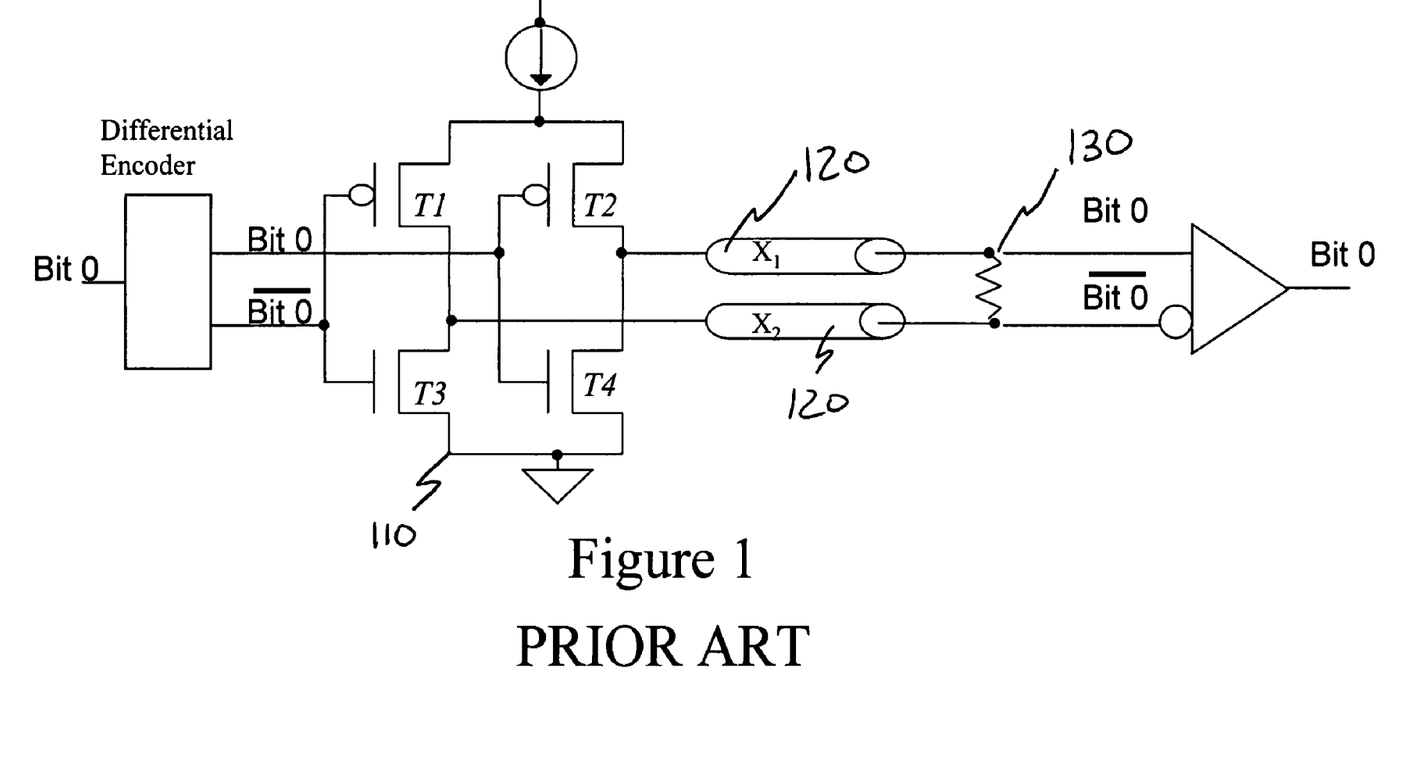
FIG. 1 shows the architecture of a conventional single-bit differential link.

To actually implement an nCm signaling methodology, three basic components are involved: a new current-steering driver design; a termination network that creates a self-consistent common node within the network, and the nCm encoding rule for the data in the channel. To illustrate the structure and use of an MBDS signaling link, a comparison is made between an exemplary MBDS link (FIG. 2) according to the present invention and a conventional differential link (FIG. 1). FIG. 1 shows a conventional single-bit differential link, and FIG. 2 is a model of a 4C2 multi-bit differential link.

The conventional single-bit differential link (FIG. 1) includes a driver circuit 110, a set of coupled transmission lines 120, and a termination network 130 between outputs of the transmission lines. The driver circuit 110 operates by steering a constant supply current between legs of the circuit and thus through paths in the termination network 130.

This conventional differential signaling network operates in two states. In the first state ('0'), transistors T1 and T4 are turned on and transistors T2 and T3 are turned off which connects the bias current supply to the bottom transmission line X2 through the termination resistor to X1 and to ground via transistor T4. In the opposite state ('1'), transistors T2 and T3 are turned on, T1 and T4 are turned off, and the current flow reverses direction. The net effect on the termination network 130 is that the polarity of the voltage across the termination resistor is reversed between the two states. An attached differential receiver distinguishes this change in voltage polarity.

The FIG. 2 circuit model for a 4C2 MBDS link operates in a similar manner. Like many other high-speed links, the MBDS link uses current mode logic in which the driver circuit 210, shown on the left side of FIG. 2, operates by steering a constant supply current through different paths in the termination network 240. All of the resistors 242 in the termination network 240 have the same value, chosen to match the impedance of the transmission lines 230, regardless of the width of the link. Each resistor 242 is preferably wired between its corresponding transmission line 230 and a common node 244 shared by all of the termination resistors 242. Since every MBDS code symbol is encoded with exactly the same number of 1-bits (see below) and the current-per-bit ($I_{bit}$) is constant, the voltage of the common node 244 will likewise remain constant. FIG. 2 also shows data encoder 250 and decoder 260.

Using current mode logic, one bit of data is encoded through each termination resistor 242, the collection of all bits referred to herein as a "code word." For example, in the 4C2 system of FIG. 2, exactly two of the termination resistors 242 will each source $I_{bit}$ into the common node 244 at any one time. At the same time, exactly two other resistors will always sink the same current. A differential receiver between the transmission line 230 output and the common node 244 reference senses each data bit as a differential voltage that changes polarity in each state relative to the common node voltage.

In more detail, the transistors of the driver circuit 210 of the MBDS link of FIG. 2 can be manipulated to encode data in a similar manner to the conventional differential link of FIG. 1. For example, to send a '0110' code word, transistors T1, T4, T6 and T7 are turned on and transistors T2, T3, T5 and T8 are turned off. Current is thereby steered through the termination network 240 from X1 and X4 to X2 and X3.

The outputs are sensed across each resistor 242 between the transmission line output and the common mode reference 244. Like the single-bit differential case, the data is sensed as the voltage polarity across this resistor 242. Thus, the two circuits can utilize the same type of receivers. In fact, each individual output of the MBDS channel is fully compatible with commercial standard low voltage differential signaling (LVDS) receivers. This is an important feature since it illustrates that receiver circuitry for these links is scalable to wide (multi-bit) links with no loss of performance.

Unlike a conventional differential signal where signal and noise appears on both legs of the differential receiver, a MBDS receiver includes signal and common mode noise on one leg and common mode noise only at a medial relative voltage at the other. This configuration has equivalent common mode noise rejection but a smaller differential voltage. However, in both cases, signal to noise ratio and noise margin are comparable. This phenomenon occurs because the voltage difference measured across the entire termination network that corresponds to the encodings of the 1-bit and 0-bit states will be the same. The termination network divides both the data signal and noise powers equally and references the difference to the center voltage of the common node.

The above comparison between a conventional single-bit differential link and an exemplary MBDS link illustrates that the MBDS link shares the same overall electrical characteristics (through a similar but improved topology) that are well known in the art to support high performance in a single-bit differential link. Specifically, both links use a current steering design to reduce switching noise introduced through the power supply rails. Both links support coupled transmission behavior for reduced loss and greater signal integrity. Both links measure signals as relative voltage across a termination resistor with common mode connections for noise rejection. It is the code density advantages (due to nCm encoding) of the MBDS link, while maintaining these advantageous electrical characteristics, that provides the greatest improvement over the prior art.

These code density advantages of MBDS links, when compared to prior art differential schemes, arise from the nCm encoding rules for code symbols. In any particular channel configuration, these advantages are expressed as a particular combination of lower pad count, lower power and additional code capacity. Details of the nCm coding scheme are provided below for a full understanding of the invention.

In the general case, consider the set X such that $X_{nm} = \{x_{nm}: x \in nCm\}$. In other words, $X_{nm}$ is the set of all n-bit valid code symbol encodings (i.e., code words) in an nCm channel such that all code words have exactly m 1-bits and (n−m) 0-bits. The size of $X_{nm}$, which is the number of available codes, is determined by equation 1.

$$\Phi\{X_{nm}\} = n!/[(n-m)!m!] \qquad \text{equation 1}$$

For any value of n, the number of valid nCm code words is maximal when m is chosen to be equal to n/2, rounded either up or down if the value of n is odd.

Regardless of the number of code words within the channel, each code word must be mapped to a binary data value at the inputs and outputs of the channel. Since incoming and outgoing data bit width will always be an integral number of binary bits, we define the effective bit width ($bit_{eff}$) to be the number of bits in the binary data coming into and out of the channel before encoding and after decoding. The value of $bit_{eff}$ for a particular nCn MBDS encoded bus is given by equation 2.

$$Bit_{eff} = \text{floor}(\log_2(\Phi\{X_{mn}\})) \qquad \text{equation 2.}$$

Using effective bit width $bit_{eff}$ as a metric, Table 1 compares the relative power consumption, pad count and code utilization for several different MBDS channel configurations to a conventional differentially encoded bus with an equivalent effective bit width.

TABLE 1

| Channel Type | $\phi\{X_{mn}\}$ | $Bit_{eff}$ | $P_{eff}$ | RP | Code Util. |
|---|---|---|---|---|---|
| 2C1 | 2 | 1 | 100% | 100% | 100% |
| 4C2 | 6 | 2 | 100% | 100% | 66% |
| 5C2 | 10 | 3 | 66% | 83% | 80% |
| 6C3 | 20 | 4 | 75% | 75% | 80% |
| 7C3 | 35 | 5 | 60% | 71% | 91% |
| 8C4 | 70 | 6 | 66% | 66% | 91% |
| 10C5 | 252 | 7 | 71% | 71% | 51% |
| 11C5 | 462 | 8 | 63% | 69% | 55% |
| 12C6 | 924 | 9 | 66% | 66% | 55% |

In Table 1, the relative power consumption of the two links is computed as $P_{eff} = m/bit_{eff}$, the ratio of m, the number of wires energized to '1' in the nCm MBDS channel, to $bit_{eff}$, which corresponds to the number of differential channels required to send the same information, each having one wire energized. The relative pad count (RP) is computed as $RP = n/(2*bit_{eff})$, the ratio of n, the number of wires in the nCm channel, to $2*bit_{eff}$, the number of differential channels required to send the same information, multiplied by two wires per channel.

From the data in Table 1, it is clear that a 30%-40% improvement in power efficiency and pad utilization is achieved using the present invention for relatively small values of n. Further, by selecting odd values of n, it is possible to trade smaller pad count reductions for greater power efficiency. Thus, depending on the desired application, the MBDS system can be structured for maximum spatial efficiency (wire/pad count) or power efficiency.

The rightmost column in Table 1 is a measure of the number of "extra" code symbols left over after encoding all of the $2^{bit_{eff}}$ input data words to primary code symbols in the nCm encoding. These extra, unused, code words are available for other uses, such as error checking (ECC), protocol support or other link management functions. The number of extra codes varies significantly between different channel configurations. However, the effectiveness of these codes for additional link functions such as ECC can be enhanced by encoding the function over multiple code words in temporal or spatial sequences.

In one example of the use of these extra codes, check bits for a complex ECC encoding can be mapped into selection of code words within the encoder circuit. In this way an nCm encoded MBDS channel can be implemented with lightweight or in some cases weightless ECC encoding, meaning that ECC information is carried in the channel with minimal (or zero) code bit overhead. There is no such equivalent capability in a conventional differentially encoded channel.

Figure 4:
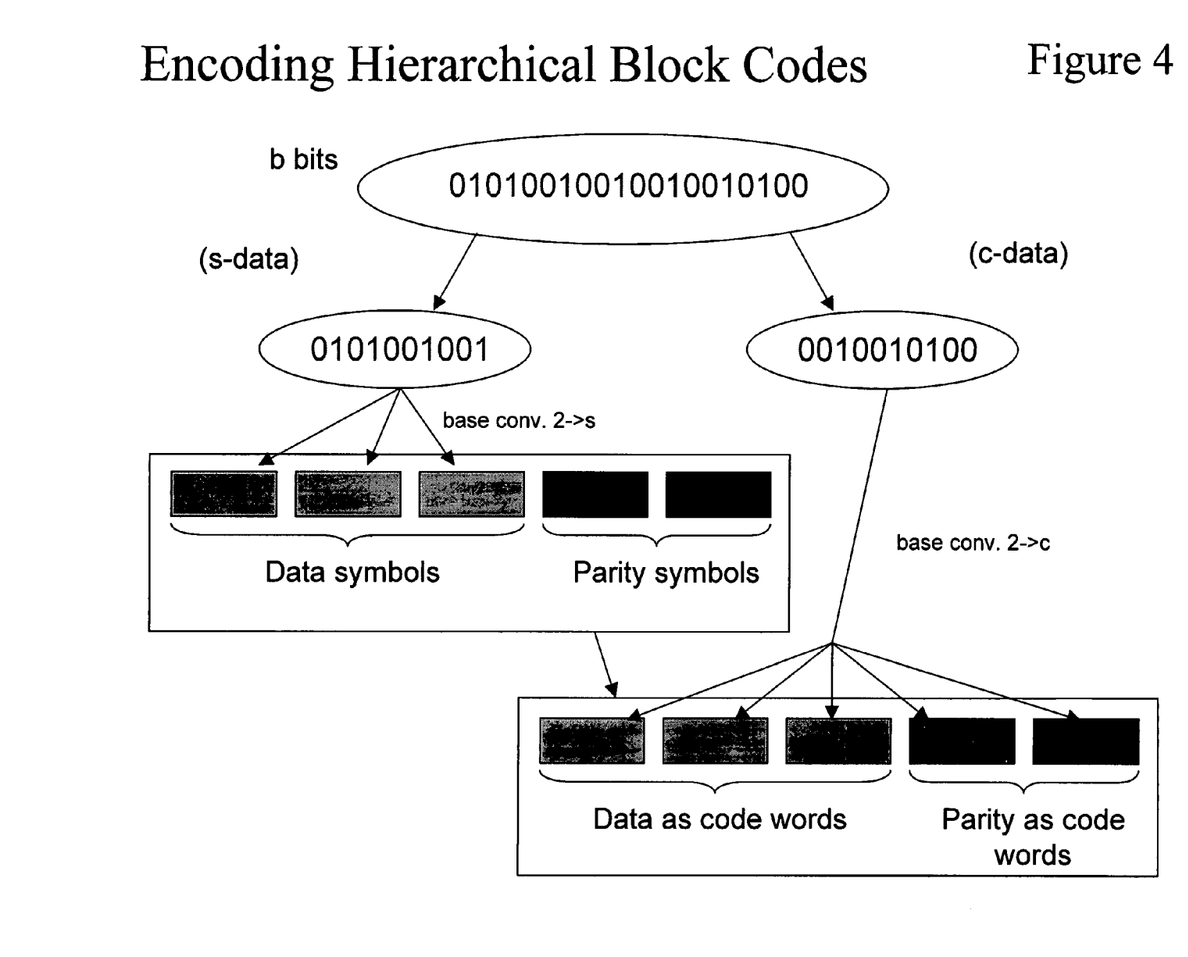
FIG. 4 illustrates an exemplary method for lightweight and weightless complex ECC coding according to the present invention.

In one approach to the implementation of lightweight ECC depicted generally in FIG. 4, an nCm code set is partitioned into s equal-sized subsets, each subset containing c code words and having a predetermined binary Hamming distance. Both the subsets and the code words within each subset are enumerated. For encoding, binary data is split into two portions, called the s-data and the c-data. The s-data is converted from binary into base-s symbols. One or more base-s parity symbols are then computed and appended. The c-data is converted from binary into base-c symbols and encoded by choosing particular nCm code words from the subsets specified by the already encoded s-data and parity symbols.

For decoding, each nCm code word is resolved into its corresponding base-s symbol and base-c symbol. Received code words that are corrupted may be corrected if the corresponding subset value is known. This subset number is determined using information from the original sequence of base-s symbols. This code is lightweight because only $\log_2 s$ bits are required for ECC overhead, as opposed to traditional codes where the overhead required is $\log_2 n$ (where n is the total number of nCm code words). In addition, unused code words are utilized in the conversion between binary and base-s and base-c symbols.

Another potential use of the extra code words is the implementation of a second variable bandwidth channel over the same link. For example, if the extra codes are used to assign duplicate encodings to specific binary value, an additional bit of information can be "hidden" in the channel as the choice between the two duplicate encodings used. Each time any of the values with duplicate encodings is sent, one more hidden bit moves through the channel. The throughput (effective bandwidth) of this hidden channel vary based on the frequency of transmission for values with duplicate encodings. There is no such equivalent capability in a conventional differentially encoded channel.

As an example, consider a channel encoded with a 6C3 MBDS encoding and thus having an effective bit width of 4-bits. From Table 1 (and equation 2) the number of valid 6C3 code words available in this channel is 20. Based on the effective bit width, 2⁴=16 of these values are assigned to encode the ordinary binary values (0-15). We refer to these 16 encodings as the primary encodings. The remaining four 6C3 code words, the extra codes, are assigned as duplicate, secondary, encodings to any four values selected the primary encodings. In this example consider that secondary encodings are assigned to the values 0, 4, 8 and 12.

In operation, when any code other than these four are transmitted only the primary encoding is available. However, when a 0, 4, 8 or 12 moves through the channel, the encoding circuitry may chose either the primary or secondary encoding. Both will be recognized by the decoder as the same target value but the particular selection of primary or secondary encoding represents one additional bit of information sent through the channel. This additional bit represents a hidden, variable bandwidth secondary channel. The effective bandwidth of the channel depends on the statistical probability that a binary value transmitted through the channel will be one of the values with a duplicate encoding.

I/O channels are precious commodities in semiconductor devices. This secondary channel capability will be particularly attractive for supporting applications such as online test pins and other types of diagnostic capabilities that may not be otherwise implemented for lack of I/O pins to support them.

The use of extra code words to provide for additional link functionality is not limited to the two examples described above. There is a multiplicity of other possible implementations including but not limited to channel control protocols, link tuning information, and channel integrity data that might exploit this additional code space. The ability to support these functions transparently within the channel is a unique new feature and capabilities of the present invention.

While the examples shown here all use binary data representations, the basic idea of multi-signal-differential channels is valid for multi-valued non-binary symbols. In such a system each channel could have one of several values. The code set would be the set of symbols where the sum of the channels is always the same constant value. For example in a ternary system with four channels, the symbols could be 0, 1, 2, and the legal code symbols would then be: (0022) (0202) (2020) (2200) (2002) (0220) (1111) (1102) (1120) (0211) (2011) (0112) (2110) (1021) (1201) (1012) (1210) (2101) (0121) where each symbol sums to 4. The summation at the receiver would still be a passive network, and the receivers would each compare one "trit" to the reference value of 4. To simplify the receiver design the reference could be scaled by ¼ to "1" and then each trit would be compared against this reference.

Layout Issues

The previous discussion of the advantages of the present invention assumes that the EMI (electromagnetic interference) in the multi-conductor coupled transmission line can be kept balanced for wider links (with more parallel conductors). In other words, when viewing the EMI characteristics of the parallel transmission lines in cross-section (perpendicular to the long axis), symmetry in the field of the interference (i.e., electromagnetic coupling of the lines) is desired in all directions. When utilizing the present invention, although the total number of 1-bits present on the transmission lines will always be known (and will be constant), the location of which particular lines carry the 1-bits will change over time. Hence, balancing the EMI must be considered for all potential code word cases and transitions.

FIG. 3 shows exemplary calculated EMI fields for various multi-layer PCB transmission line orientations for the cases 2C1 and 4C2. Generally orientations in which the transmission lines 300 exist in a single plane are shown in FIGS. 3A-3D and orientations in which the transmission lines 300 are in multiple planes are shown in FIGS. 3E-3G. It is noteworthy that for the 2C1 case (a conventional differential implementation), the EMI is balanced or symmetrical in all directions for states 01 and 10. However, the 4C2 cases illustrates symmetry only in certain cases, or, in other words, has different EMI field patterns for different bit patterns carried on the transmission lines. The transmission line are not always coupled to each other.

In certain embodiments of the present invention, EMI symmetry is obtained using embedded ground conductors between the patterns of parallel conductors to reduce the deleterious variations between the individual line coupling due to various code sequences. Various arrangements of the embedded conductors can be used depending on the desired characteristics of the transmission lines. The lines themselves may be arranged in box, diamond or other patterns, with "dummy" conductors inserted for coupling purposes.

Alternative Optical Embodiment

As briefly described above, the present invention could also be adapted for high-speed optical communications, as well as many other high-speed communications systems utilizing technologies other than those described above. For example, MBDS could be used for a multi-channel fiber ribbon-based optical link in very short reach (VSR) applications. The method is based on a hybrid of differential signaling and single-ended channels. In general, channels are grouped into code blocks of n-bits, and each code word transmitted in the block is restricted to conform to an nCm rule. One exemplary MBDS optical system is described below.

Figure 5:
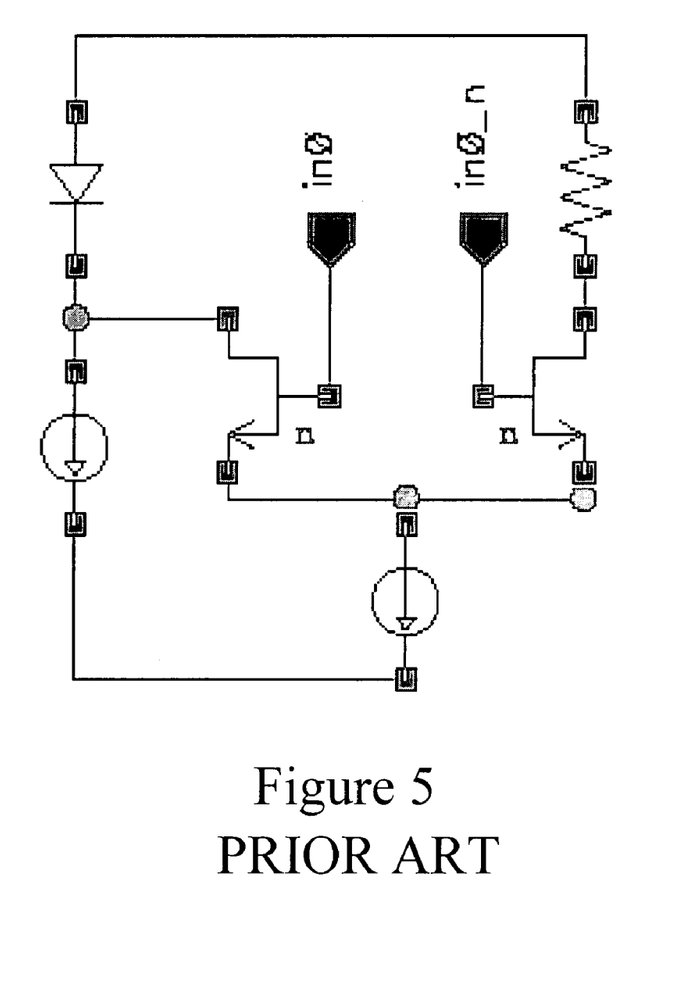
FIG. 5 illustrates an electrical model for a typical single-ended VCSEL optical driver circuit.

FIG. 5 illustrates an electrical model for a conventional prior art single-ended VCSEL driver circuit. The driver circuit is designed to operate with a constant supply current to minimize switching noise and crosstalk through the supply rail (as in the embodiments described above). A code state transition does not require switching a current supply on or off but instead modulation current is switched between the VCSEL and an equivalent dummy load on the opposite side of the differential driver. The weakness of this design stems from the conversion from differential to single-ended signaling as power is wasted in the dummy load.

Figure 6:
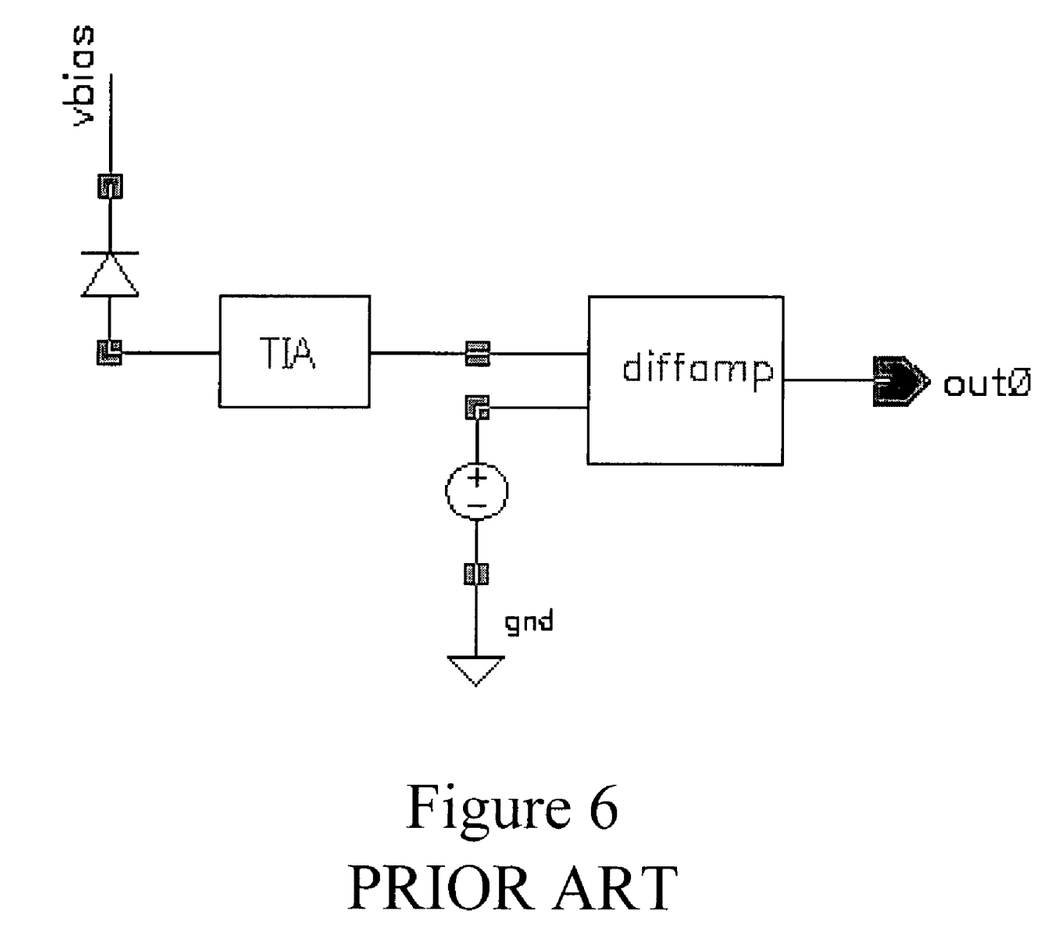
FIG. 6 illustrates an electrical model for a typical optical receiver.

FIG. 6 illustrates an electrical model for a conventional prior art optical receiver for use with the driver in FIG. 5. In this case, the conversion for single-ended optics to differential electronics happens at the output of the transimpedance amplifier where a fixed (or feedback) voltage is applied to the opposite input of the differential amplifier. This voltage is critical to the proper operation of the receiver, but it provides none of the common mode noise rejection of a fully differential channel.

In a 4-channel, bidirectional POP4 transceiver, an array of these drivers and receiver circuits is interfaced to VCSEL and detector arrays and packaged with a 12 fiber ribbon connector. In link operation, 4 of the 12 fibers are input, 4 are output, and 4 are dark (unused). According to this embodiment of the present invention, this standard link would be modified such that all 12 fibers are utilized as a pair of 6C3 links, one link for input signals and one link for output signals.

Figure 7:
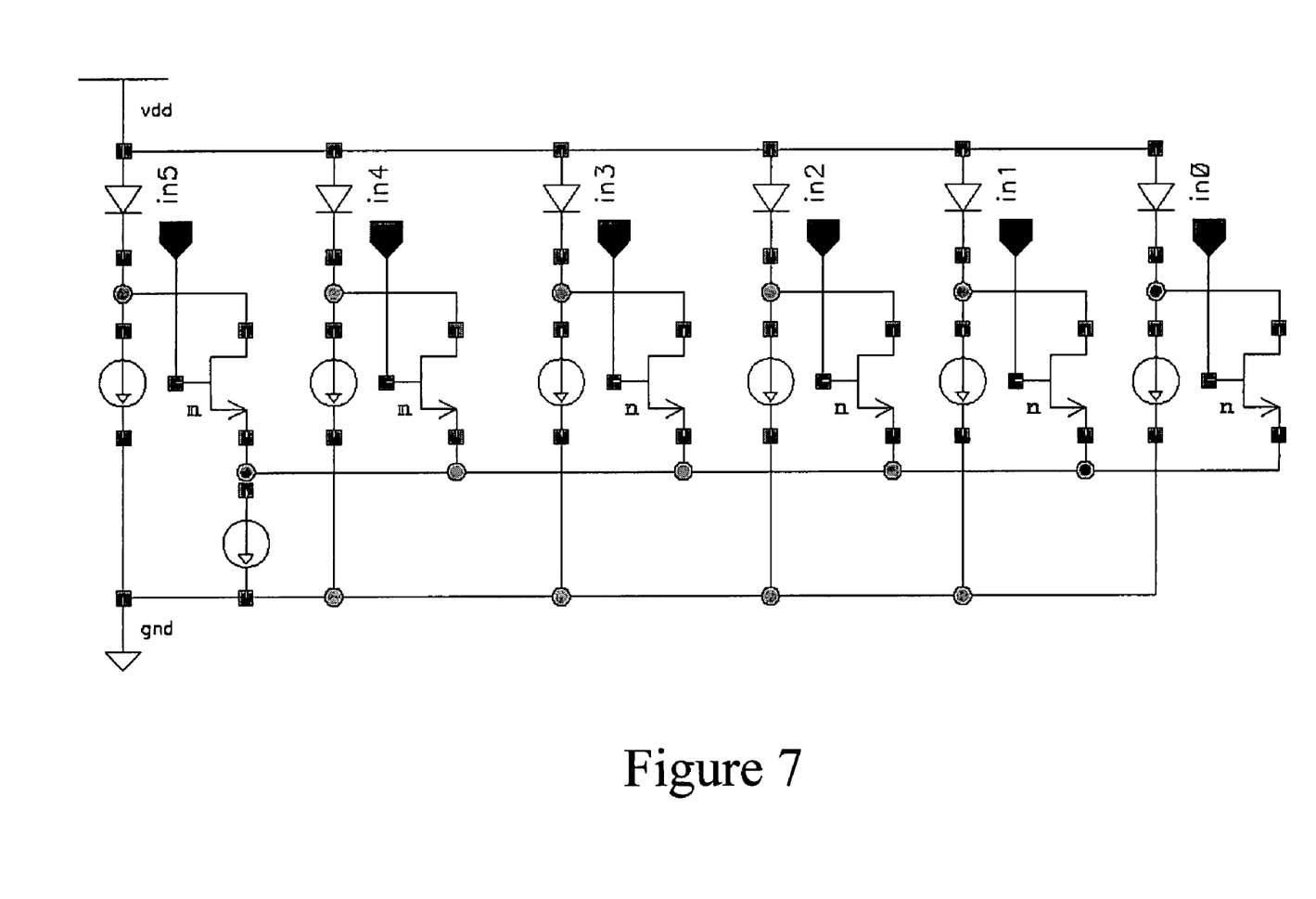
FIG. 7 is a model of a VCSEL driver for a 6C3 link output.
Figure 8:
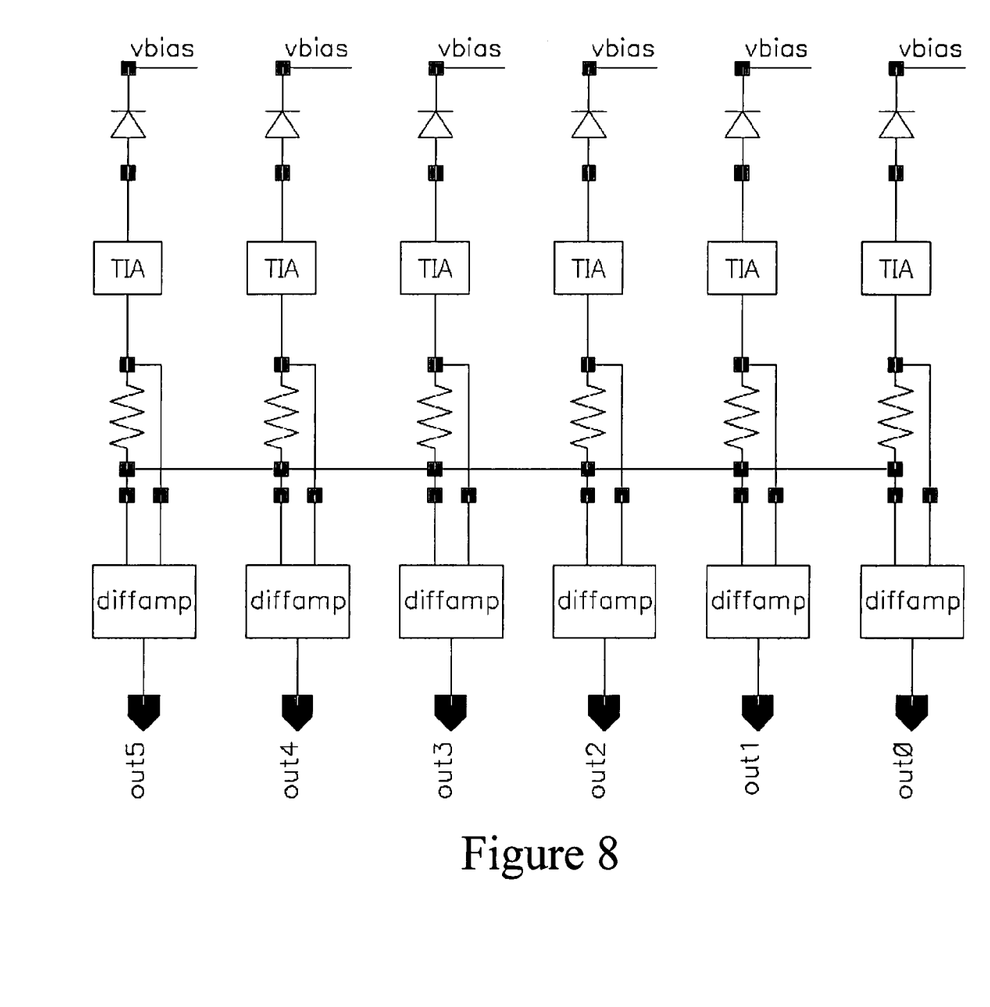
FIG. 8 details the corresponding receiver for the driver circuit shown in FIG. 7.

FIGS. 7 and 8 illustrate an application of the present invention to the conventional optical system of FIGS. 5 and 6. Specifically, FIG. 7 is a model of a VCSEL driver for a 6C3 link output and FIG. 8 details the corresponding receiver.

In FIG. 7, two sets of current sources control the total current through the driver. Independent bias current controls are attached to each VCSEL allowing it to be independently biased. The six transistors in the 6C3 modulation network control modulation current at each VCSEL with common drains connected to the modulation current control. The constant total modulation current is switched between sets of exactly three VCSEL loads for any code word sequence sent through the channel. Thus, the driver has similar noise and bandwidth characteristics to the POP4 driver shown in FIG. 5, but it supports the higher code density of the fixed load link.

In the corresponding receiver depicted in FIG. 8, each of the photodiode currents is independently amplified and converted to voltage in separate transimpedance amplifiers. The key component of the receiver design is the resistor network at the output of the TIAs. This "star" network creates a relative reference on the center node of the star that is shared by an array of differential amplifiers in the second stage. Since at any time, exactly three of the six channels will be on and three off, the relative voltage across each of the termination resistors will reverse based on the logic state of the incoming channel. By retaining a pair-wise differential architecture, the receiver is easily scalable to wide channel implementations limited only by the noise margins for sensing voltage across the resistor network.

In sum, the MBDS link of the present invention maintains advantageous electrical characteristics of conventional high-speed differential communications links while improving other aspects (e.g., reducing power consumption) of the system. A brief summary of these advantages is presented below.

Improved power efficiency compared to conventional systems is achieved because nCm code symbols are encoded with fewer '1-bits' used to send an equivalent amount of information. Given that both fixed bit-load (MBDS) and conventional differential channels use current-mode logic, energy is expended for each 1-bit transmitted in order to charge the transmission lines and to maintain current flow through the termination resistors. By reducing the number of 1-bits in the encoding, the overall power consumption is likewise reduced. For example, a 5C2 channel can send three bits of information per symbol using only two 1-bits per symbol encoding. An equivalent set of three differential channels requires three 1-bits, the MBDS link using 33% less power.

Further, less silicon area and lower pad/wire count is required for an nCm channel than an equivalent set of differential channels, and the overall width of the nCm channel is reduced. For example, a 6C3 channel can send 4 bits of information using 6 I/O pads/wire for the link. An equivalent set of four differential channels uses 8 pads/wires. The 6C3 implementation, therefore, uses 25% fewer I/O pads.

Higher effective bandwidth is available because more information is delivered to the receiver per symbol. The larger symbol set of an nCm channel means that each code word imparts more information per symbol received. For example, a comparison of 4 differential channels (which requires 8 wires) to an 8C4 link demonstrates that each message on the differential channel transmits 1 of 16 possible symbols, or 4 bits. The 8C4 link transmits 1 of 70 possible code symbols which corresponds to over 6 bits per message. Thus, the same link has 1.5 times higher effective bandwidth.

Moreover, a low amount of noise in the driver circuit results from the current steering design of the driver that operates with constant current in all code states. A transition from one code state to the other does not introduce switching noise to the power supply.

Coupled transmission line behavior will also occur as long as the link transmission lines or printed circuit boards are properly designed and the signals are routed in parallel and in close proximity. The embedded set of transmission lines will be electromagnetically coupled resulting in lower loss and greater signal integrity.

Finally, common mode noise rejection in a pair-wise differential receiver is achieved because the link output signal as delivered to the receiver is a relative voltage drop across the termination resistor network. The receiver senses each encoding state as a change in polarity of this voltage. Common mode noise appears identically on both sides of the resistor in either state. Thus, the noise is cancelled by differential receiver circuitry, substantially enhancing the signal to-noise ratio of the output.

Nothing in the above description is meant to limit the present invention to any specific materials, geometry, or orientation of elements. Many part/orientation substitutions are contemplated within the scope of the present invention and will be apparent to those skilled in the art. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered only to facilitate comprehension of the invention and should not be construed to limit the scope thereof.

What is claimed is:

1. A multi-signal differential communication system for carrying encoded data symbols, comprising:
    a communication channel with n means of signal transmission;

encoded data symbols transmitted on said channel, wherein said data symbols are encoded with multiple signals according to an encoding rule such that the total energy of all signals in each encoded data symbol sums to the same constant for all valid data symbols transmitted in said channel; and a means for generating encoded data symbols to be carried on each of the n means of signal transmission such that the total energy of all signals in each encoded data symbol sums to the same constant for all valid data symbols transmitted in said channel.

2. The multi-signal differential communication system of claim 1, further comprising:

a means for generating a common reference relative to the total energy in the channel against which each signal in the data symbol can be compared.

3. The multi-signal differential communication system of claim 2, further comprising:

a means for differentially measuring said signals based on comparison of said common reference and the signal on each of said n means of signal transmission.

4. The multi-signal differential communication system of claim 3, wherein said means for generating encoded data symbols further comprises an encoder that translates incoming information into valid symbols such that the total energy of all signals in each encoded symbol sums to the same constant for all valid data symbols transmitted in said channel.

5. The multi-signal differential communication system of claim 4, wherein the number of incoming information symbols is smaller than the number of valid symbols in the channel and said encoding means has the capability to translate selected incoming information symbols to any one of a plurality of valid target symbols, thereby adding additional information to the channel.

6. The multi-signal differential communication system of claim 5, wherein said encoder translates incoming information into valid symbols using n binary signals with an n choose m encoding rule such that there are exactly m 1-bits and (n–m) 0-bits in all valid symbols.

7. The multi-signal differential communication system of claim 5, further comprising:

a collection of receivers for receiving symbols, wherein each receiver differentially measures each signal in a received symbol relative to the generated common reference;

and a decoder that translates from the received symbol encoding to outgoing information from the channel.

8. The multi-signal differential communication system of claim 6, wherein said means for generating encoded data symbols further comprises a collection of n receivers for receiving symbols, wherein each receiver differentially measures each signal in a received symbol relative to the generated common reference and each generates one bit in an n-bit binary symbol;

and a decoder that translates from the received binary symbol encoding to the outgoing information from the channel.

9. A multi-bit differential communication system for carrying encoded data symbols, wherein each valid data symbol in the channel must correspond to an n-choose-m encoding rule, comprising:

a driver circuit;

a communications channel with n means of signal transmission connected to said driver circuit; and a termination network connected to said communications channel such that a constant virtual reference is created in said termination network at a common voltage node at which each of the n means of transmission is connected, wherein said encoded data symbols are encoded in an n choose m format.

10. The system of claim 9, wherein said communications channel is a single channel.

11. The system of claim 9, wherein said communications channel includes a plurality of sub-channels wherein each sub-channel is a multi-bit differential channel that in combination forms a k-bit bus.

12. The system of claim 9, further comprising:

at least one differential receiver connected to said termination network between the common voltage node and one of the signal nodes.

13. The system of claim 9, wherein n is greater than 2.

14. The system of claim 9, wherein said encoded data symbols are made up of a set of primary code words and a set of extra code words used for an alternative purpose.

15. The system of claim 14, wherein said extra code words are used for ECC coding.

16. The system of claim 14, wherein said extra code words are used to create an additional communications channel.

17. The system of claim 9, wherein the transmission lines run in parallel with each other and are characterized by substantially symmetrical electromagnetic interference in all directions.

18. The system of claim 17, further comprising;

at least one additional conductor running in parallel to aid transmission lines to reduce the electromagnetic interference.

19. A multi-bit-differential communication system implementing a k-bit binary bus system, comprising:

a communications channel consisting of n means of parallel transmission of binary hit signals;

a means for encoding incoming information into a set of valid symbols wherein all valid symbol encodings conform to an n-choose-m encoding rule;

a means for energizing the means of transmission such that the total energy in the channel is constant for all valid code symbols;

a means of generating a common reference signal value based on the energy in all of the signals in the channel;

a set of n means for differentially receiving each symbol by individual comparison of each signal with the generated common reference; and a means for decoding the received symbols for the n-choose-n symbol encodings to the outgoing k-bit binary information on the channel.

* * * * *